(12) United States Patent
Ozeki et al.

(10) Patent No.: US 6,617,527 B2
(45) Date of Patent: Sep. 9, 2003

(54) PRINTED CIRCUIT BOARD HAVING A PAIR OF GROOVES EXTENDING THE ENTIRE LENGTH

(75) Inventors: Masahiro Ozeki, Yokohama (JP); Motoshi Shindoh, Fujisawa (JP); Hiroyuki Ryu, Tokyo (JP)

(73) Assignee: Victor Company of Japan, Limited, Kanagawa-Ken (JP)

( * ) Notice: Subject to any disclaimer, the term of this patent is extended or adjusted under 35 U.S.C. 154(b) by 0 days.

(21) Appl. No.: 09/969,032

(22) Filed: Oct. 3, 2001

(65) Prior Publication Data

US 2002/0060090 A1 May 23, 2002

(30) Foreign Application Priority Data

Oct. 3, 2000 (JP) .......................................... 2000-303293

(51) Int. Cl.$^7$ ................................................. H05K 1/11
(52) U.S. Cl. ........................ 174/261; 174/266; 361/795
(58) Field of Search ................................ 174/260–266; 361/792–795

(56) References Cited

U.S. PATENT DOCUMENTS

| | | | |
|---|---|---|---|
| 4,642,160 A | * 2/1987 | Burgess ........................ 216/18 |
| 4,882,454 A | * 11/1989 | Peterson et al. ............ 174/252 |
| 5,077,115 A | * 12/1991 | Arthur et al. ................ 361/748 |
| 5,108,553 A | * 4/1992 | Foster et al. ................. 205/125 |
| 5,320,894 A | * 6/1994 | Hasegawa ................... 174/250 |
| 5,367,435 A | * 11/1994 | Andros et al. ............... 174/263 |
| 5,463,191 A | * 10/1995 | Bell et al. .................... 174/256 |
| 5,774,340 A | * 6/1998 | Chang et al. ................ 174/255 |
| 5,879,787 A | * 3/1999 | Petefish ....................... 174/256 |

\* cited by examiner

Primary Examiner—David L. Talbott
Assistant Examiner—Jose H. Alcala
(74) Attorney, Agent, or Firm—Connolly Bove Lodge & Hutz LLP

(57) ABSTRACT

A printed circuit board includes an insulative substrate. A first conductive layer having a predetermined width and length is formed on the insulative substrate, the first conductive layer extending in a first direction. A first insulative layer is formed over the first conductive layer. A circuit pattern having a narrower width than that of the first conductive layer is provided in parallel with the first direction of the first conductive layer, the circuit pattern being formed on the first insulative layer. A second insulative layer is formed over the circuit pattern. A pair of grooves is formed alongside the entire length of both sides of the circuit pattern and in the first and second insulative layers so as to expose the first conductive layer, the pair of grooves extending in a second direction parallel to the first direction so as to sandwich the circuit pattern there between. A second conductive layer is formed on the second insulative layer continuously from an inner wall of one of the pair of grooves to an inner wall of another groove of the pair of grooves so as to connect to the first conductive layer. The second conductive layer is connected to the first conductive layer through the first and second insulative layers forming a structure that surrounds the circuit pattern.

1 Claim, 5 Drawing Sheets

PRINTED CIRCUIT BOARD HAVING A PAIR OF GROOVES EXTENDING THE ENTIRE LENGTH

BACKGROUND OF THE INVENTION

1. Field of the Invention

The present invention relates to a printed circuit board and a manufacturing method of the printed circuit board, particularly, relates to a printed circuit board having a structure of transmission line, which is hardly affected by external noise, low in scattering of impedance and excellent in a transmission characteristic, and a manufacturing method of the printed circuit board.

2. Description of the Related Art

Recently, with entering into an informational age, equipment such as a communication terminal has been widely spread. Following this situation, equipment has been progressed in high frequency and a mobile terminal equipment of which radio frequency (RF) signal is in an order of GHz has been introduced in a market. Further, even in a memory subsystem of a personal computer, a higher speed processing has been advanced in a frequency of some hundreds MHz. In response to this trend, a printed circuit board being excellent in a transmission characteristic of which impedance is controlled in accordance with a higher frequency is demanded.

FIG. 5 is a cross sectional view of a printed circuit board according to the prior art.

FIGS. 6(a) through 6(d) are cross sectional views of a printed circuit board of the prior art for explaining a manufacturing process.

In FIG. 6(a), a copper foil formed on an insulative resin substrate 10 composed of glass epoxy, for example, is wet etched through a photolithography process and an inner layer circuit pattern 11 having a predetermined shape is obtained.

In FIG. 6(b), a surface treatment such as blacking process is applied on a surface of the inner layer circuit pattern 11. Insulative resin layer is formed on the insulative resin substrate 10 so as to cover the inner layer circuit pattern 11 by using a screen printing process or a curtain coating process, or by sticking a sheet material of insulative resin on the insulative resin substrate 10. Consequently, an insulative layer 12 is obtained. A thickness of the insulative layer 12 is 20 to 90 µm. A blind hole, which reaches to the inner layer circuit pattern 11, or a through hole, which passes through the insulative resin substrate 10, is provided at a predetermined position on the insulative resin layer 12.

In FIG. 6(c), after roughening a surface of the insulative layer 12 with oxidizing agent, a copper layer is formed over the insulative layer 12 by the electroless plating method or electrolytic plating method, and then a conductive layer 13 is obtained. With respect to a degree of roughness on the surface of insulative resin layer 12, an average roughness Ra in the center line is approximately 0.1 to 20 µm. Further, a thickness of the conductive layer 13 is from some µm to some tens µm.

In FIG. 6(d), an outer layer circuit pattern 14 having a predetermined shape is obtained by forming the conductive layer 13 through the wet etching process by the photolithography. Consequently, a printed circuit board having two layers of circuit patterns can be obtained. Further, in a case of multi-layering circuit patterns, it is accomplished by repeating the above-mentioned processes shown by FIGS. 6(b) through 6(d).

An impedance of transmission line in the printed circuit board mentioned above is mainly defined by a thickness and permittivity of insulative resin layer, a thickness and width of conductive layer of the transmission line and a configuration of grounding. Particularly, a strip line and an impedance of micro strip line are affected by a thickness of insulative resin layer and a line width of transmission line.

FIGS. 7(a) and 7(b) are ideal structures of transmission line and show a micro strip line and a strip line respectively.

In the micro strip line shown by FIG. 7(a), an impedance Zo1 of transmission line, which is composed of a first circuit pattern 1 for grounding, a first insulative resin layer 2 and a second circuit pattern 3 for signal formed over the insulative resin layer 2, can be given by a following formula (1).

$$Zo1 = \frac{60}{\sqrt{\varepsilon r 0.475 + 0.67}} LN \frac{5.98 h1}{W 0.8 + t} [\Omega] \quad (1)$$

where "εr" is a permittivity of the first insulative resin layer 2, "h1" is a thickness of the first insulative resin layer 2, "w" is a width of the second circuit pattern 3 for signal and "t" is a thickness of the second circuit pattern 3 respectively.

In the strip line shown by FIG. 7(b), an impedance Zo2 of transmission line, which is composed of a first circuit pattern 1 for grounding, a first insulative resin layer 2 and a second circuit pattern 3 for signal formed over the insulative resin layer 2, a second insulative resin layer 4 formed on the first insulative resin layer with covering over the second circuit pattern 3 and a third circuit pattern 5 for grounding, can be given by a following formula (2).

$$Zo2 = \frac{60}{\sqrt{\varepsilon r 0.475 + 0.67}} LN \frac{5.98 h1}{W 0.8 + t} \times \frac{1}{\sqrt{\frac{1 + h1}{h2 \varepsilon r / \varepsilon r 2 + h1}}} [\Omega] \quad (2)$$

where "εr2" is a permittivity of the second insulative resin layer 4 and "h2" is a thickness of the second insulative resin layer 4 respectively. The other symbols are the same as those of the formula (1).

An RF of mobile communication terminal equipment such as a mobile telephone is mostly in a GHz band. An RF signal received by an antenna installed in the equipment flows through a circuit pattern for signal on a printed circuit board and is stepped down to some hundreds MHz in an intermediate frequency section. Finally the RF signal is stepped down to some tens MHz in a base-band. In order to obtain excellent receiving sensitivity of equipment, a transmission characteristic in a printed circuit board from an antenna to an intermediate frequency section is most important.

In order to prevent external noise deteriorating a transmission characteristic, a grounding line is provided in parallel to a circuit pattern for signal, which is a transmission line of printed circuit board. As shown in FIG. 5, a second circuit pattern 14a is formed above a first circuit pattern 11a for grounding being isolated by an insulative resin layer 12 provided between the first and second circuit patterns 11a and 14a. Circuit patterns 14b1 and 14b2 are provided along both sides of the second circuit pattern 14a in a predetermined distance.

On the contrary, the construction shown in FIG. 5 is insufficient in a shielding effect, so that equipment installing the printed circuit board is easily affected by an external noise and causes inferior receiving sensitivity.

Generally, an electromagnetic field in a high frequency can penetrate into a shallower depth from a surface of conductive material due to a skin effect. Consequently, a high frequency current flows through a surface layer of metal. A skin thickness δ of surface layer, where a high frequency current flows through, is given by a following formula (3).

$$\delta = \sqrt{\frac{2}{\mu\sigma\omega}} = \frac{1}{\sqrt{\pi f \sigma \mu}} [m] \quad (3)$$

where "$\mu$" is a permeability of conductive material, "$\sigma$" is a conductivity of the conductive material and "$\omega$" is an angular frequency of an electromagnetic field respectively.

A circuit pattern for signal to be a transmission line is composed of a copper layer. If a signal frequency is 1 GHz, a skin depth is approximately 2 $\mu$m. Consequently, it is apparent that a signal current just flows through a skin layer of circuit pattern.

FIGS. 8(a) and 8(b) are ideal drawings showing a current distribution of signal in a printed circuit board of the prior art. FIG. 8(a) shows a current distribution of signal in a lower frequency. FIG. 8(b) shows a current distribution of signal in a higher frequency. As shown in FIG. 8(a), a second circuit pattern 14a for signal is allocated on a first circuit pattern 11a for grounding being isolated by an insulative resin layer (not shown). A signal current in a lower frequency flows through the second circuit pattern 14a in a direction shown by an arrow "$i_s$" and a return current flows through the first circuit pattern 11a in a direction shown by an arrow "$i_r$". Current lines indicated by a black dot "●" in the second circuit pattern 14a are uniformly distributed, and a current uniformly dispersed flows through the first circuit pattern 11a with utilizing the width of the first circuit pattern 11a maximally.

On the other hand, FIG. 8(b) shows a current distribution of a higher frequency signal of, for example, more than 10 MHz. A skin effect is remarkable and a current flow on an outer circumference area of the second circuit pattern 14a for a signal. In the first circuit pattern 11a for grounding, a current flows in a section under the circuit pattern 14a concentrically. In this case, the signal current tends to be concentrated at the section under the circuit pattern 14a and the return current tends to be concentrated at an upper section of the circuit pattern 11a.

The skin effect is more remarkable if the frequency exceeds 1 GHz. In this case, a current is omnipresent sectionally if the second circuit pattern for signal is scattered and defective structurally. An impedance value being different from a predetermined value causes a large amount of scatter in impedance. Consequently, a high frequency transmission characteristic becomes unstable.

SUMMARY OF THE INVENTION

Accordingly, in consideration of the above-mentioned problems of the prior art, an object of the present invention is to provide a printed circuit board and a manufacturing method of the printed circuit board, which is hardly affected by an external noise and has a high frequency transmission line excellent in a transmission characteristic and low scattering in impedance.

In order to achieve the above object, the present invention provides, according to an aspect thereof, a printed circuit board comprising: an insulative substrate; a first conductive layer having a predetermined width and length being formed on the insulative substrate; a first insulative layer formed over the first conductive layer; a circuit pattern having a narrower width than that of the first conductive layer being provided in parallel with the longitudinal direction of the first conductive layer, wherein the circuit pattern is formed on the first insulative layer; and a second insulative layer formed over the circuit pattern, the printed circuit board further comprising: a plurality of grooves formed on both sides of the circuit pattern in the first and second insulative layers so as to expose the first conductive layer; and a second conductive layer formed on the second insulative layer continuously from an inner wall of one of the plurality of grooves to an inner wall of another groove out of the plurality of grooves so as to connect to the first conductive layer, wherein the second conductive layer connected to the first conductive layer through the first and second insulative layers forms a structure of surrounding the circuit pattern.

According to another aspect of the present invention, there provided a manufacturing method of a printed circuit board comprising steps of: forming a first conductive layer having a predetermined width and length, a first insulative layer, a circuit pattern having a narrower width than that of the first conductive layer provided in parallel with the longitudinal direction of the first conductive layer and a second conductive layer in order; forming a plurality of grooves on both sides of the circuit pattern in the first and second insulative layers so as to expose the first conductive layer; and forming a second conductive layer on the second insulative layer continuously from an inner wall of one of the plurality of grooves to an inner wall of another groove out of the plurality of grooves so as to connect to the first conductive layer, wherein the second conductive layer connected to the first conductive layer through the first and second insulative layers forms a structure of surrounding the circuit pattern.

Other objects and further features of the present invention will be apparent from the following detailed description when read in conjunction with the accompanying drawings.

DETAILED DESCRIPTION OF THE PREFERRED EMBODIMENTS

Figure 1:
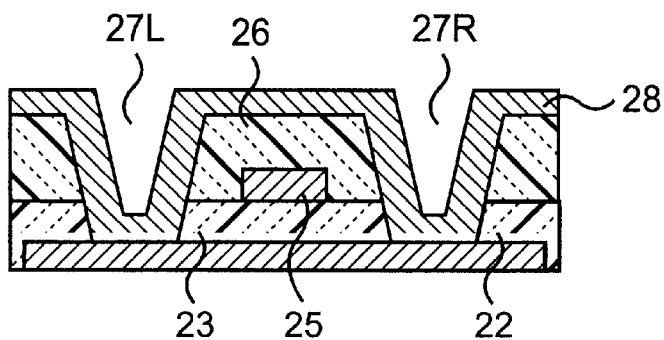
FIG. 1 is a cross sectional view of a printed circuit board according to an embodiment of the present invention.

FIG. 1 is a cross sectional view of a printed circuit board according to an embodiment of the present invention.

FIGS. 2(a) through 2(g) are cross sectional views of a printed circuit board according to the embodiment of the present invention for explaining a manufacturing process.

In FIG. 1, a printed circuit board is composed of an inner circuit pattern 22, which is formed on a substrate (not shown) of insulative resin, a first insulative layer 23, a circuit pattern 25 for signal as a transmission line of signal and a second insulative layer 26, wherein the inner circuit pattern 22, the first insulative layer 23, the circuit pattern 25 and the second insulative layer 26 are laminated in order. Further, a conductive layer 28 is provided on both side surfaces of first and second grooves 27L and 27R, which are formed on the first and second insulative layers 23 and 26, and a top surface of the second insulative layer 26 along an extending direction of the inner circuit pattern 22. The conductive layer 28 is electrically connected to the inner circuit pattern 22.

Figure 2A:
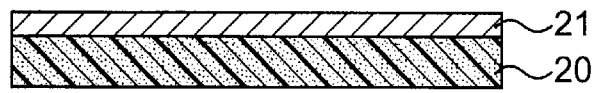
FIGS. 2(a) through 2(g) are cross sectional views of a printed circuit board according to the embodiment of the present invention for explaining a manufacturing process.

As shown in FIG. 2(a), a copper clad laminated board, which is stuck with copper foil 21 in a predetermined thickness over an insulative substrate 20 composed of glass epoxy, for example, is prepared first.

Figure 2B:
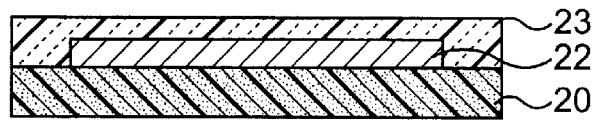

Then, as shown in FIG. 2(b), an inner circuit pattern 22 in a predetermined shape is formed by wet etching the copper foil 21 through the photolithography, wherein the inner circuit pattern 22 extends to a direction perpendicular to the surface of the drawing and is a circuit pattern for grounding having a length equivalent to or longer than a length of a circuit pattern 25 for signal. The circuit pattern for grounding is formed by applying a surface treatment such as a blackening process on the surface of the inner circuit pattern 22 and further by laminating a resin layer consisting of bisphenol A epoxy resin mainly, for example, on the blackened surface of the inner circuit pattern 22 through a screen printing process or a curtain coat method or just laminating a sheet material on the blackened surface of the inner circuit pattern 22 so as for the resin layer to be a first insulative layer 23. In this particular case, a thickness of the first insulative layer 23 is 20 to 90 $\mu$m. It will be explained later that the first insulative layer 23 shall be specified to be an appropriate thickness if impedance of a circuit pattern for signal being formed on the first insulative layer 23 is controlled.

Figure 2C:
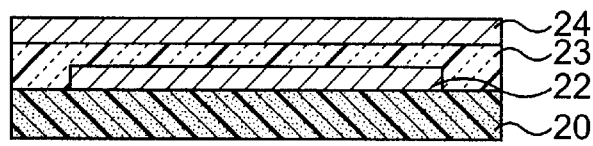

In FIG. 2(c), a copper layer 24 is formed over the first insulative layer 23 through a process of electroless plating or electrolytic plating after roughening the surface of the first insulative layer 23 by oxidizing reagent. With respect to a degree of surface roughness, average roughness Ra in center line is approximately 0.1 to 20 $\mu$m. A thickness of the copper layer 24 is some $\mu$m to some tens $\mu$m.

Figure 2D:
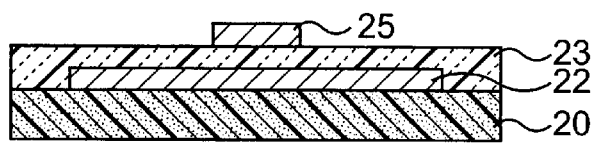

In FIG. 2(d), a circuit pattern 25 for signal having a predetermined shape is formed by processing the copper layer 24 through wet etching such as the photolithography. The circuit pattern 25 is to be a transmission line for high frequency signal and extends to a direction perpendicular to the surface of the drawing as same manner as the inner circuit pattern 22 (circuit pattern for grounding). In a case of controlling impedance of the circuit pattern 25, its pattern width is specified to be an appropriate value.

Figure 2E:
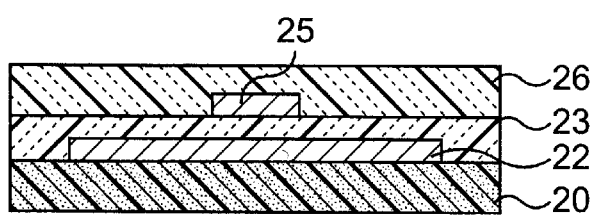

In FIG. 2(e), after applying a surface treatment such as a blackening process on the surface of the circuit pattern 25, a second insulative layer 26 is formed by laminating a resin layer consisting of bisphenol A epoxy resin mainly, for example, on the blackened surface of the circuit pattern 25 through a screen printing process or a curtain coat method, or just laminating a sheet material of resin on the blackened surface of the circuit pattern 25. A thickness of the second insulative layer 26 is 20 to 90 $\mu$m. In a case of controlling impedance of the circuit pattern 25 for signal, the second insulative layer 26 shall be specified to be an appropriate thickness.

Figure 2F:
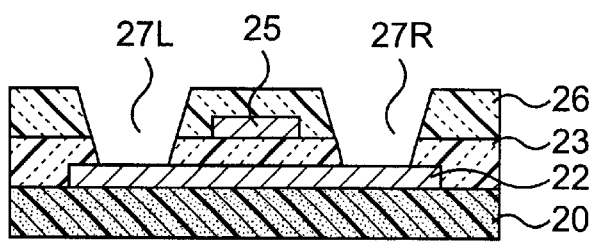

In FIG. 2(f), grooves 27L and 27R are formed on the second and first insulative layers 26 and 23 in a direction perpendicular to the surface of the drawing and in a same distance as the circuit pattern 25 and in parallel with both side surfaces of the circuit pattern 25 by using a $CO_2$ laser beam or like. The grooves 27L and 27R make the inner circuit pattern 22 expose.

A non-through hole is formed by irradiating a laser beam under conditions such that a pulse having a cycle of 1 to 5 kHz is used, an irradiating time is 10 to 60 micro seconds and a number of shots is 3 to 5. The grooves 27L and 27R are formed by making a non-through hole repeatedly and by moving a position of the laser beam continuously. An upper width of the groove is within a range of 150 to 260 $\mu$m and an inclination angle of the groove is within a range of 45 to 85 degrees. With respect to a laser beam, a YAG laser and an excimer laser can be used.

In a case that the grooves 27L and 27R are formed by the photolithography, the second and first insulative layers 26 and 23 are etched by a wet or dry process through the photolithography after a photo resist layer is formed over the second insulative layer 26 by sticking a dray film or by a screen printing process.

Figure 2G:
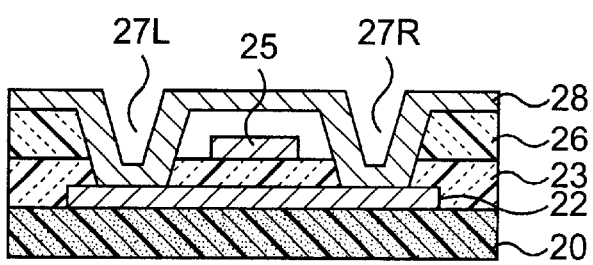
Figure 5:
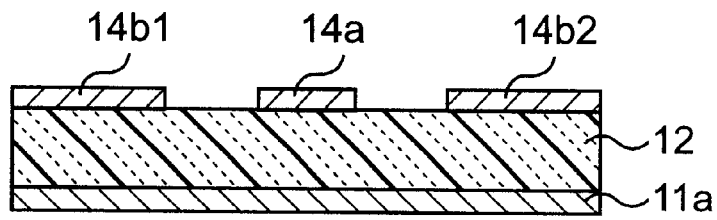
FIG. 5 is a cross sectional view of a printed circuit board according to the prior art.
Figure 6A:
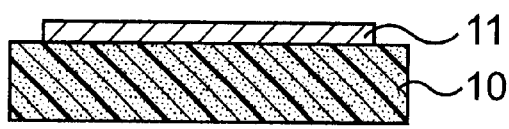
FIGS. 6(a) through 6(d) are cross sectional views of a printed circuit board of the prior art for explaining a manufacturing process.
Figure 6B:
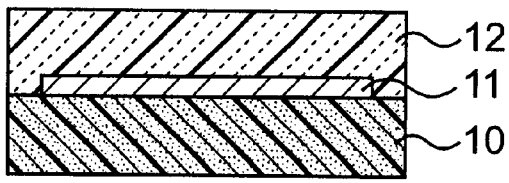
Figure 6C:
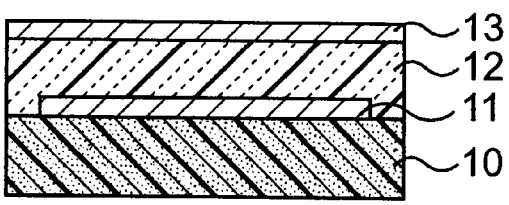
Figure 6D:
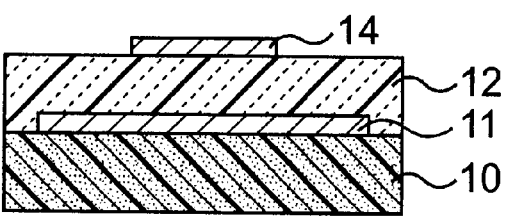

Finally, as shown in FIG. 2(g), a surface of the second insulative layer 26 and inner walls of the grooves 27L and 27R are roughened by oxidizing reagent mainly consisting of permanganate. A conductive layer 28 is formed over the roughened surfaces of the second insulative layer 26 and the grooves 27L and 27R by plating copper through an electroless or electrolytic plating process. With respect to a roughness degree of the surface of the second insulative layer 26 and the inner walls of the grooves 27L and 27R, the average roughness Ra in center line is approximately 0.1 to 20 $\mu$m. A thickness of the conductive layer 28 is some $\mu$m to some tens $\mu$m.

The conductive layer 28 is connected to the inner circuit pattern 22 at the bottoms of the grooves 27L and 27R and the circuit pattern 25 for signal is surrounded by the conductive layer 28 and the inner circuit pattern 22 through the first and second insulative layers 23 and 26.

As shown in FIG. 1, in the printed circuit board manufactured as mentioned above, the circuit pattern 25 for signal is surrounded by the first and second insulative layers 23 and 26 and further surrounded by the conductive layer 28 and the inner circuit pattern 22 (circuit pattern for grounding) being connected between each other and grounded. This configuration is very similar construction to a coaxial cable. Since the circuit pattern 25 can be shielded, the circuit pattern 25 is hardly affected by an external noise. Excellent reception sensitivity can be obtained by applying the configuration particularly to a circuit pattern for signal between an RF and an intermediate frequency section.

The structure of printed circuit board according to the embodiment of the present invention is very similar to a structure of coaxial cable, so that analyzing a transmission line in the electromagnetic field mode at a high frequency can be performed more precisely by using a coaxial cable approximation.

Figure 3:
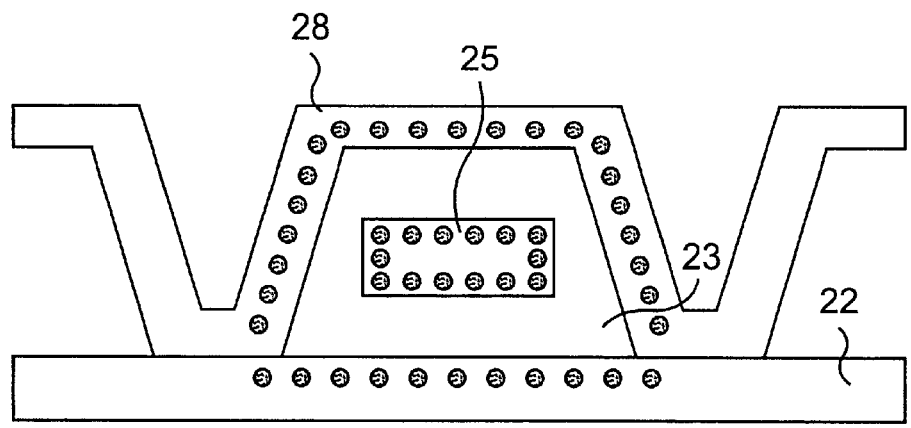
FIG. 3 is an ideal drawing showing a current distribution of signal in a printed circuit board shown in FIG. 1 according to the embodiment of the present invention.

FIG. 3 is an ideal drawing showing a current distribution of a high frequency signal in the printed circuit board shown in FIG. 1 according to the embodiment of the present invention. In FIG. 3, since the circuit pattern 25 for signal is surrounded by the inner circuit pattern 22 allocated under the circuit pattern 25 and the conductive layer 28 provided over and both side of the circuit pattern 25, which are grounded, current lines shown by a black dot in FIG. 3 are uniformly distributed on the surface of the circuit pattern 25 when a high frequency signal is passed through the circuit pattern 25. Current lines are also distributed uniformly on the surfaces of the inner circuit pattern 22 and the conductive layer 28 facing toward the circuit pattern 25 in response to the current line distribution of the circuit pattern 25. Consequently, current lines are seldom omnipresent sectionally and scattering in impedance is decreased even though there existed scattering or defects in a circuit pattern for signal.

Figure 7A:
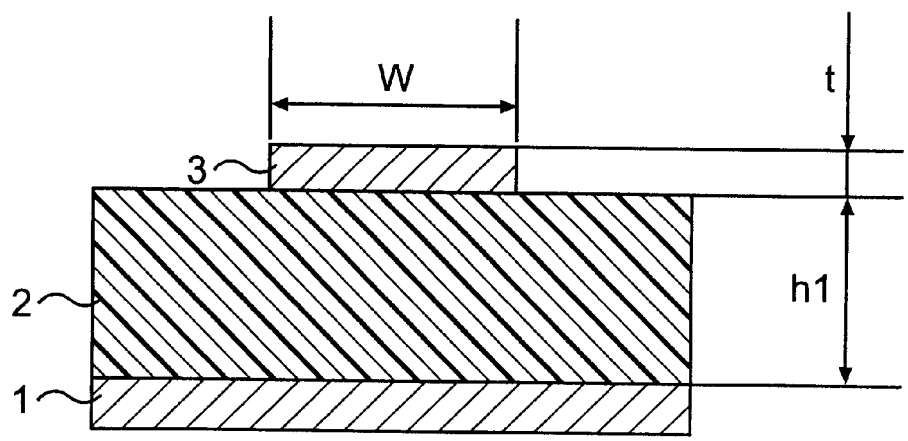
FIG. 7(a) is a cross sectional view of an ideal structure of transmission line showing a micro strip line.
Figure 7B:
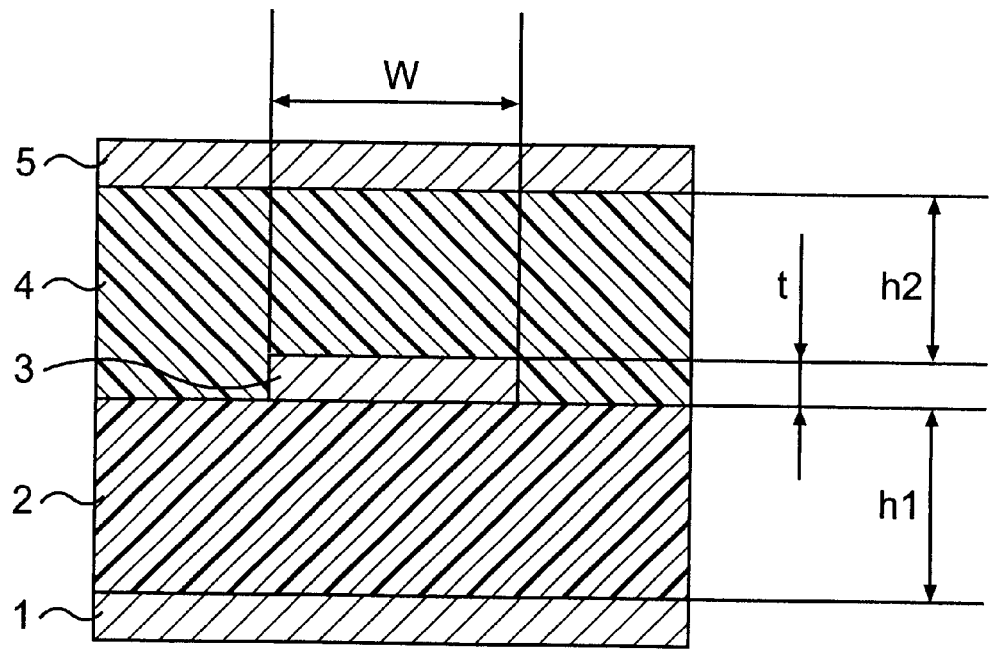
FIG. 7(b) is a cross sectional view of an ideal structure of transmission line showing a strip line.
Figure 8A:
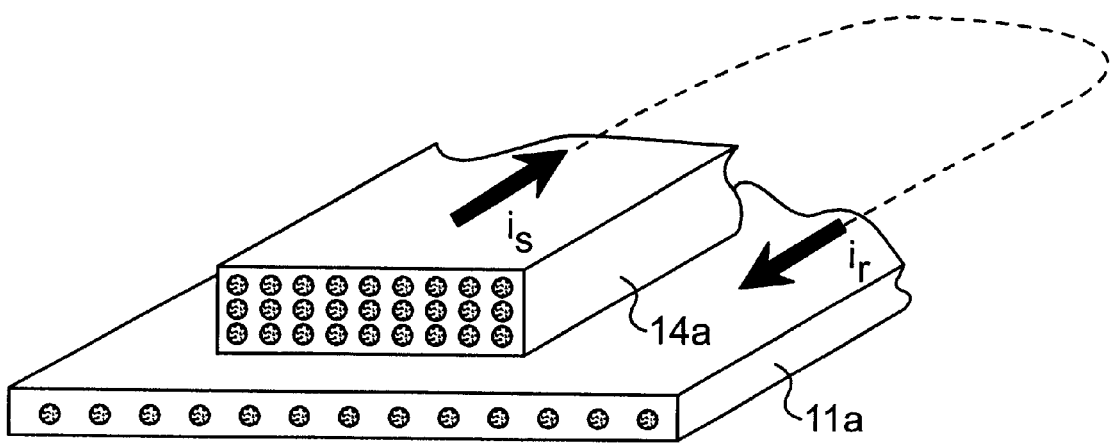
FIG. 8(a) is an ideal drawing showing a current distribution of a low frequency signal in a printed circuit board of the prior art.
Figure 8B:
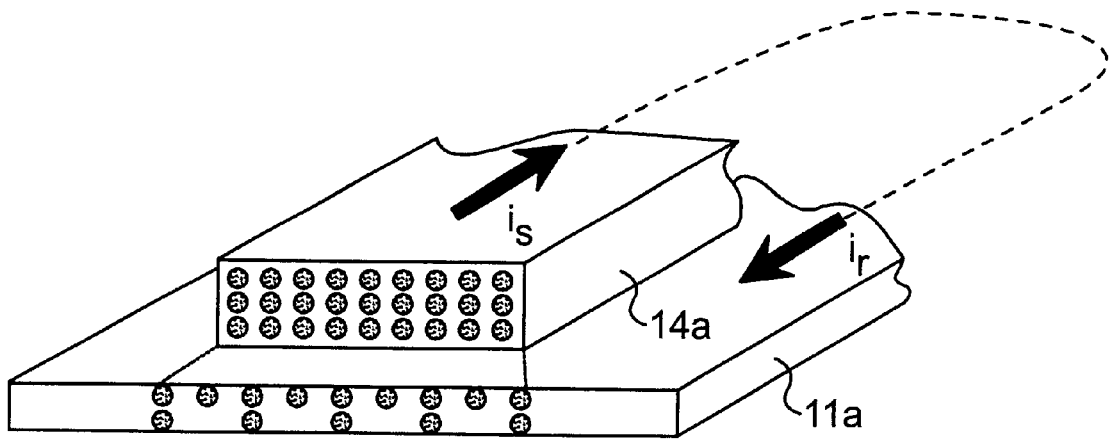
FIG. 8(b) is an ideal drawing showing a current distribution of a high frequency signal in a printed circuit board of the prior art.

Result of measuring impedance of a transmission line is detailed next. Impedance is measured by using 10 samples of a strip line of the prior art shown in FIG. 7(b) and 10 samples of the present invention, wherein impedance of each sample is adjusted to be 30 Ω by specifying each parameter.

The time domain reflectmetry (hereinafter referred to as the TDR method) is utilized for measuring impedance. Characteristic impedance of each sample is measured by using a wide range digitized oscilloscope connected with a measuring prove for the TDR method.

With respect to the TDR method, a stepped signal or a pulse signal is inputted into a transmission line to be measured as an input signal and a value of characteristic impedance is obtained by synthesizing a reflected signal, which is reflected by the transmission line and returns back to an input terminal, with the input signal and displaying the synthesized waveform. The TDR method is a measuring method of utilizing a status of transmission line, that is; a reflected signal varies by a thickness of insulative layer and a thickness and width of circuit pattern.

Figure 4:
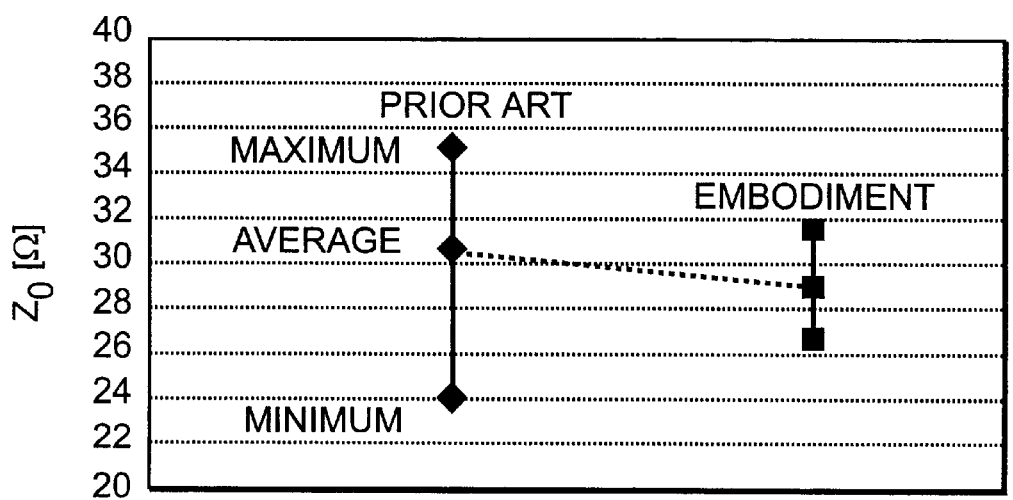
FIG. 4 is a graph showing characteristic impedance of a printed circuit board according to the embodiment of the present invention in comparison with that of the prior art.

FIG. 4 is a graph showing characteristic impedance of a printed circuit board according to the embodiment of the present invention in comparison with that of the prior art. In FIG. 4, an average impedance value of circuit pattern for signal according to the prior art is 31 Ω, and a maximum and minimum impedance values are 35.5 Ω and 24 Ω respectively. Scattering in impedance is 11.5 Ω.

On the other hand, an average impedance value of circuit pattern for signal according to the present invention is 29 Ω, and a maximum and minimum impedance values are 31.7 Ω and 26.5 Ω respectively. Scattering in impedance is 5.2 Ω. Therefore, the scattering in impedance of the present invention is a half of that of the prior art.

The impedance value of the present invention is lower than that of the prior art by 2 Ω. It is caused by increasing a capacitance component because the structure of transmission line of the present invention is similar to a structure of coaxial cable. The decreased impedance value means that a width of circuit pattern for signal can make narrower by 10 μm. Accordingly, wiring can be promoted to a higher density.

While the invention has been described above with reference to specific embodiment thereof, it is apparent that many changes, modifications and variations in the arrangement of equipment and devices and in materials can be made without departing from the invention concept disclosed herein.

According to the aspect of the present invention, there provided a printed circuit board, which is hardly affected by an external noise and has a high frequency transmission line being low in scattering in impedance and excellent in a transmission characteristic.

According to the other aspect of the present invention, there provided a manufacturing method of a printed circuit board, which is hardly affected by an external noise and has a high frequency transmission line being low in scattering in impedance and excellent in a transmission characteristic.

What is claimed is:

1. A printed circuit board comprising:

an insulative substrate;

a first conductive layer having a predetermined width and length and formed on said insulative substrate, the first conductive layer extending in a first direction;

a first insulative layer formed over said first conductive layer;

a circuit pattern having a narrower width than that of said first conductive layer being provided in parallel with said first direction of said first conductive layer, wherein said circuit pattern is formed on said first insulative layer; and a second insulative layer formed over said circuit pattern;

a pair of grooves formed alongside the entire length of both sides of said circuit pattern and in said first and second insulative layers so as to expose said first conductive layer, wherein said pair of grooves extend in a second direction parallel to said first direction so as to sandwich said circuit pattern therebetween; and a second conductive layer formed on said second insulative layer continuously from an inner wall of one of said pair of grooves to an inner wall of another groove of said pair of grooves so as to connect to said first conductive layer, wherein said second conductive layer connected to said first conductive layer through said first and second insulative layers forms a structure surrounding said circuit pattern.

* * * * *